(12) United States Patent
Furutani et al.

(10) Patent No.: US 8,891,245 B2
(45) Date of Patent: Nov. 18, 2014

(54) PRINTED WIRING BOARD

(75) Inventors: Toshiki Furutani, Ogaki (JP);
Yukinobu Mikado, Ogaki (JP);
Mitsuhiro Tomikawa, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 152 days.

(21) Appl. No.: 13/537,145

(22) Filed: Jun. 29, 2012

(65) Prior Publication Data

US 2013/0081866 A1    Apr. 4, 2013

Related U.S. Application Data

(60) Provisional application No. 61/541,567, filed on Sep. 30, 2011.

(51) Int. Cl.

| H05K 1/18 | (2006.01) |
|---|---|
| H01G 4/00 | (2006.01) |
| H01G 4/228 | (2006.01) |
| H01L 23/50 | (2006.01) |
| H01L 23/498 | (2006.01) |
| H05K 3/46 | (2006.01) |

(52) U.S. Cl.
CPC ............. H05K 1/185 (2013.01); H01L 23/50 (2013.01); H01L 23/49822 (2013.01); H05K 3/4602 (2013.01); H05K 2201/10636 (2013.01); H05K 2201/09781 (2013.01); H05K 2201/10015 (2013.01); H01L 2224/16225 (2013.01); H01L 2924/15311 (2013.01); H01L 23/49827 (2013.01); H05K 2203/1469 (2013.01)
USPC ................. 361/763; 361/301.1; 361/306.1; 361/306.3; 174/262

(58) Field of Classification Search
USPC .......... 174/260, 262, 264–266; 361/761, 763, 361/765, 301.1, 301.2, 306.1, 306.3
See application file for complete search history.

(56) References Cited

U.S. PATENT DOCUMENTS

| 7,486,525 B2 * | 2/2009 | Knickerbocker ............. 361/760 |
| 7,535,728 B2 * | 5/2009 | Chakravorty et al. ........ 361/761 |

(Continued)

FOREIGN PATENT DOCUMENTS

| JP | 2003-347700 A | 12/2003 |
| JP | 2007-288179 | 11/2007 |

(Continued)

OTHER PUBLICATIONS

U.S. Appl. No. 13/558,892, filed Jul. 26, 2012, Furutani, et al.

*Primary Examiner* — Hoa C Nguyen
(74) *Attorney, Agent, or Firm* — Oblon, Spivak, McClelland, Maier & Neustadt, L.L.P.

(57) ABSTRACT

A printed wiring board includes a core substrate having a penetrating hole, a first conductive layer on a first surface of the substrate, a second conductive layer on a second surface of the substrate, a first electronic component having an electrode and accommodated in the hole such that the electrode faces the first surface, a first structure on the first surface and including a pad for mounting a second electronic component on the first structure and a via conductor connected to the electrode, and a second structure on the second surface. The electrode has an upper surface facing toward the first surface, the first layer has an upper surface facing away from the first surface, and the first component is positioned in the hole such that the upper surface of the electrode forms a gap with the upper surface of the first layer.

19 Claims, 14 Drawing Sheets

(56) References Cited

U.S. PATENT DOCUMENTS

| | | | |
|---|---|---|---|
| 2007/0030628 A1* | 2/2007 | Yamamoto et al. | 361/311 |
| 2007/0064375 A1* | 3/2007 | Urashima et al. | 361/311 |
| 2008/0169120 A1* | 7/2008 | Inagaki et al. | 174/255 |
| 2009/0205202 A1* | 8/2009 | Tanaka et al. | 29/834 |
| 2010/0147575 A1* | 6/2010 | Lee et al. | 174/262 |
| 2011/0203839 A1* | 8/2011 | Iwamoto | 174/260 |
| 2012/0018198 A1 | 1/2012 | Furutani et al. | |
| 2012/0032335 A1 | 2/2012 | Kariya et al. | |
| 2012/0080786 A1 | 4/2012 | Furutani et al. | |

FOREIGN PATENT DOCUMENTS

| | | |
|---|---|---|
| JP | 2009-302563 A | 12/2009 |
| KR | 10-2009-0092326 | 8/2009 |
| KR | 10-1048638 | 7/2011 |
| KR | 10-2011-0100992 | 9/2011 |

* cited by examiner

FIG. 4
(A)
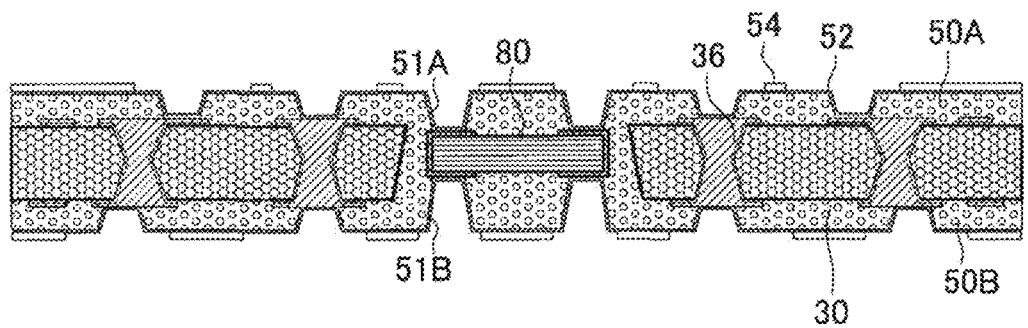
(B)
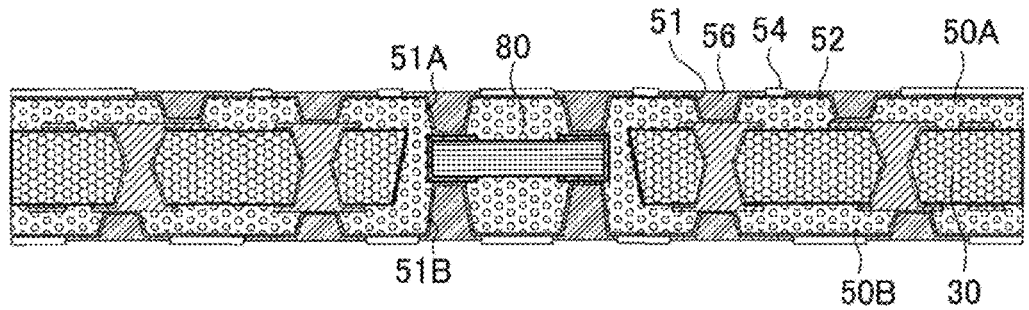
(C)
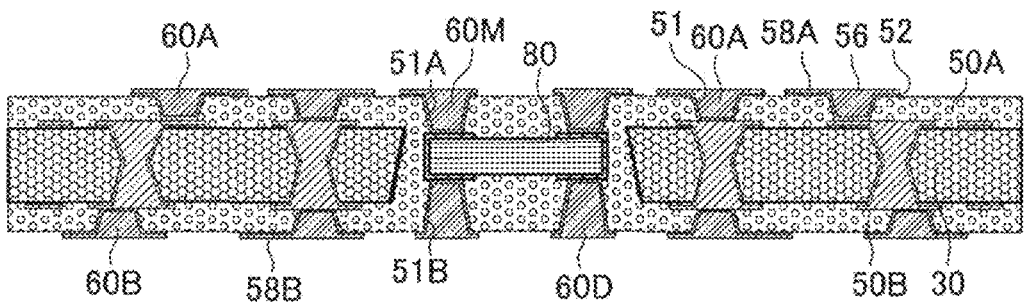

FIG. 5
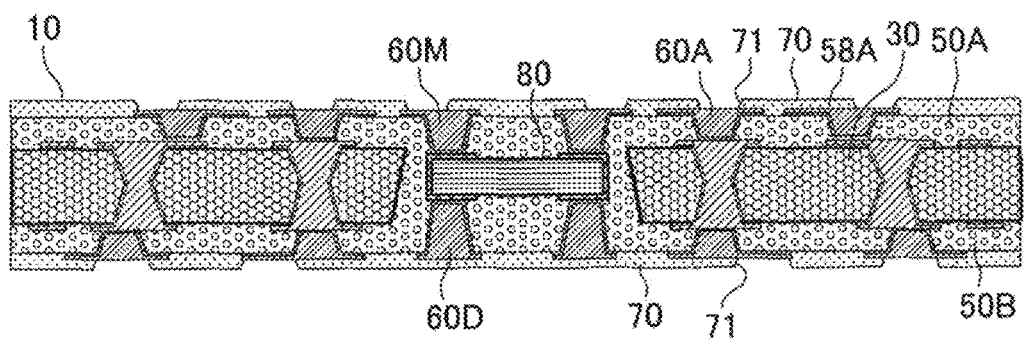
(A)
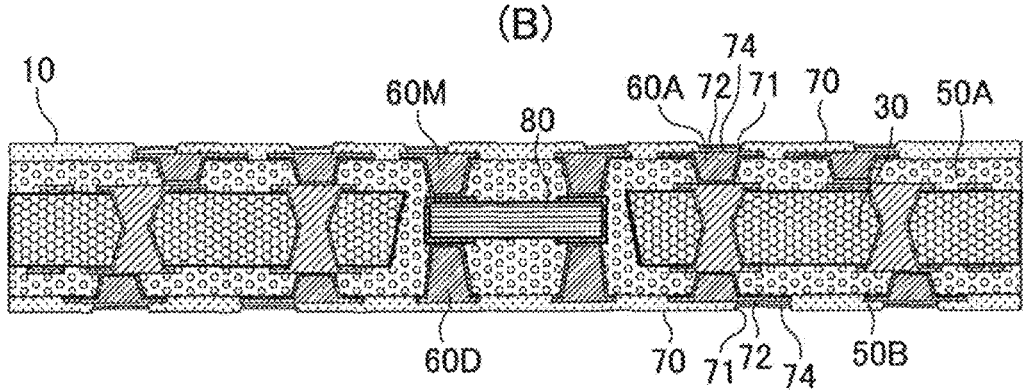
(B)

FIG. 13
(A)
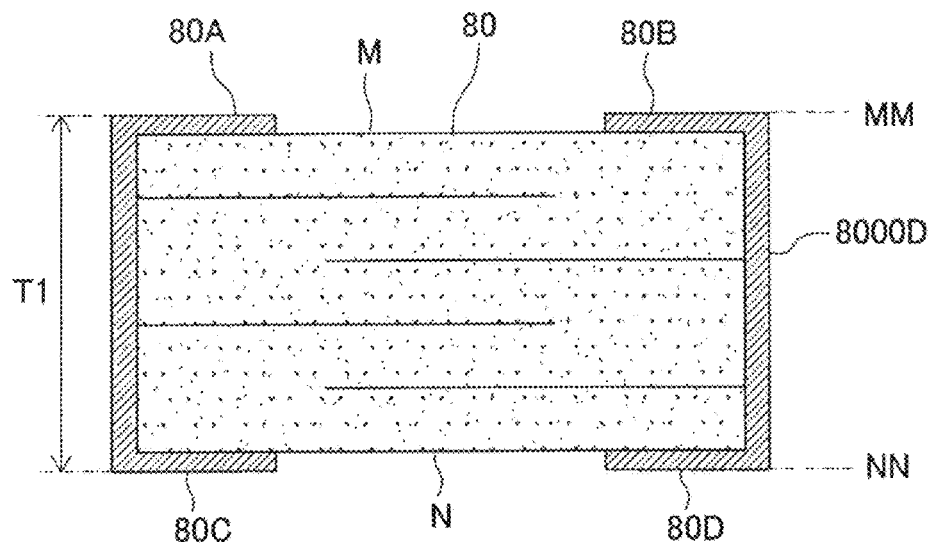
(B)
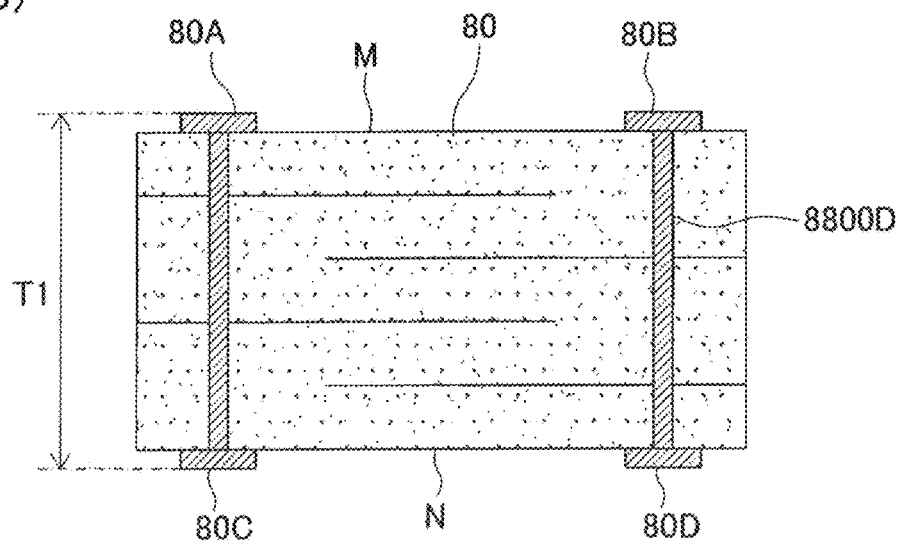

PRINTED WIRING BOARD

CROSS-REFERENCE TO RELATED APPLICATIONS

The present application is based on and claims the benefit of priority to U.S. Application No. 61/541,567, filed Sep. 30, 2011, the entire contents of which are incorporated herein by reference.

BACKGROUND OF THE INVENTION

1. Field of the Invention

The present invention relates to a printed wiring board which has a core substrate with a built-in electronic component such as a ceramic capacitor and buildup layers laminated on the core substrate.

2. Discussion of the Background

Japanese Laid-Open Patent Publication No. 2007-288179 describes a method for manufacturing a multilayer printed wiring board with a capacitor built into its core substrate. In such a manufacturing method, a penetrating hole is formed in a core substrate and a tape is placed on a first surface of the core substrate to cover the penetrating hole. Then, a ceramic capacitor is mounted on the tape and filler is filled in the penetrating hole. After that, the tape is removed from the core substrate and buildup layers are formed on the core substrate. Japanese Laid-Open Patent Publication No. 2007-288179 describes polishing surfaces of the ceramic capacitor and the core substrate after the removal of the tape, and forming resin insulation layers on the surfaces of the core substrate and the ceramic capacitor by thermal pressing. The entire contents of this publication are incorporated herein by reference.

SUMMARY OF THE INVENTION

According to one aspect of the present invention, a printed wiring board includes a core substrate including an insulative base material and having a penetrating hole formed to accommodate an electronic component, a first conductive layer formed on a first surface of the core substrate, a second conductive layer formed on a second surface of the core substrate on the opposite side of the first surface of the core substrate, a first electronic component having an electrode and accommodated in the penetrating hole of the core substrate such that the electrode of the first electronic component faces the first surface of the core substrate, a first buildup structure formed on the first surface of the core substrate and on the first electronic component and including a pad formed to mount a second electronic component on the first buildup structure and a via conductor connected to the electrode of the first electronic component, and a second buildup structure formed on the second surface of the core substrate and on the first electronic component. The electrode of the first electronic component has an upper surface facing toward the first surface of the core substrate, the first conductive layer has an upper surface facing away from the first surface of the core substrate, and the first electronic component is positioned in the penetrating hole of the core substrate such that the upper surface of the electrode of the first electronic component forms a gap with the upper surface of the first conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-4(C) are views showing a method for manufacturing a printed wiring board of the first embodiment;

FIGS. 5(A)-5(B) are views showing a method for manufacturing a printed wiring board of the first embodiment;

FIGS. 13(A)-13(B) are views illustrating the structure of a capacitor; and

DETAILED DESCRIPTION OF THE EMBODIMENTS

Figure 1:
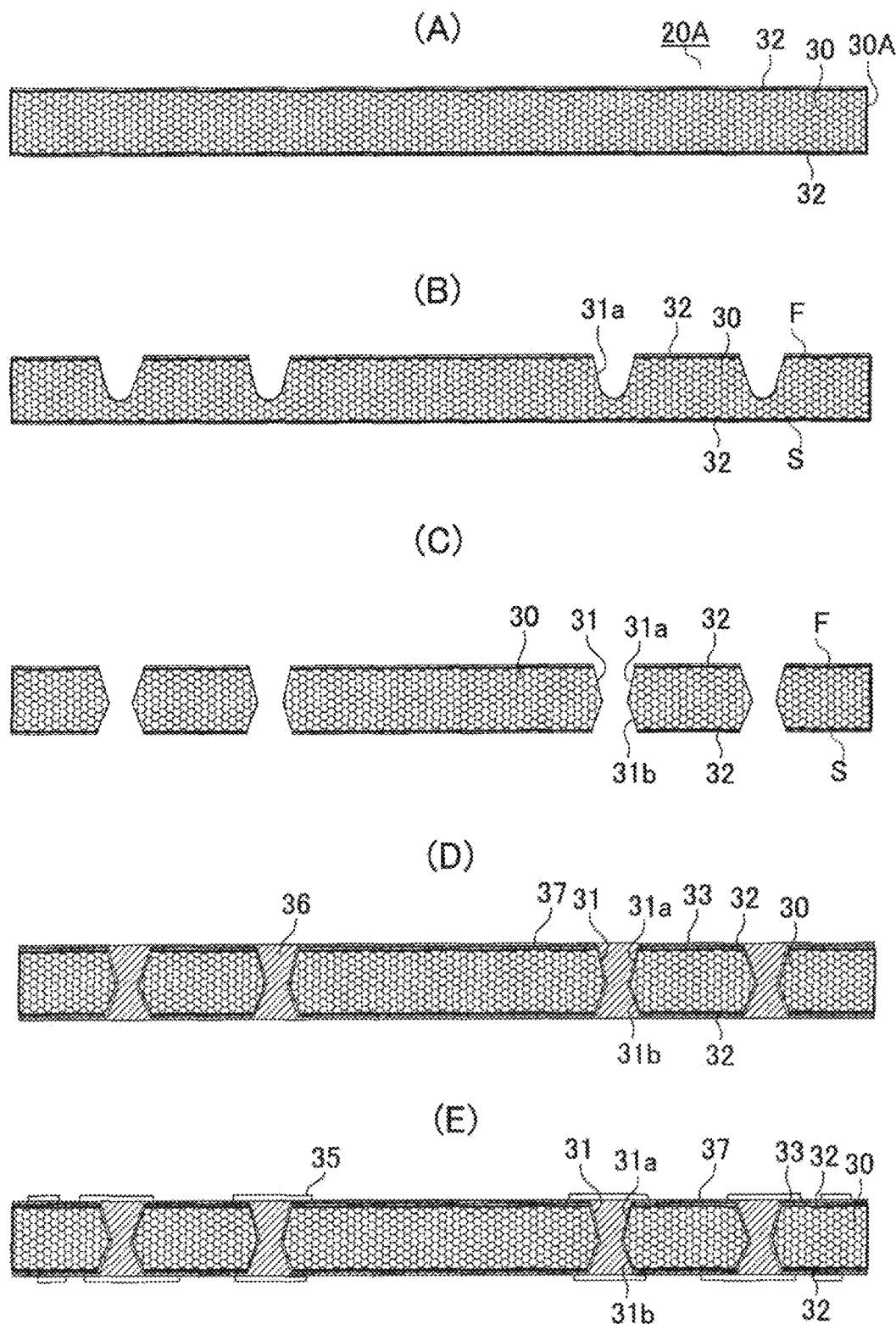
FIGS. 1(A)-1(E) are views showing steps of a method for manufacturing a printed wiring board with solder bumps according to a first embodiment of the present invention.
Figure 2:
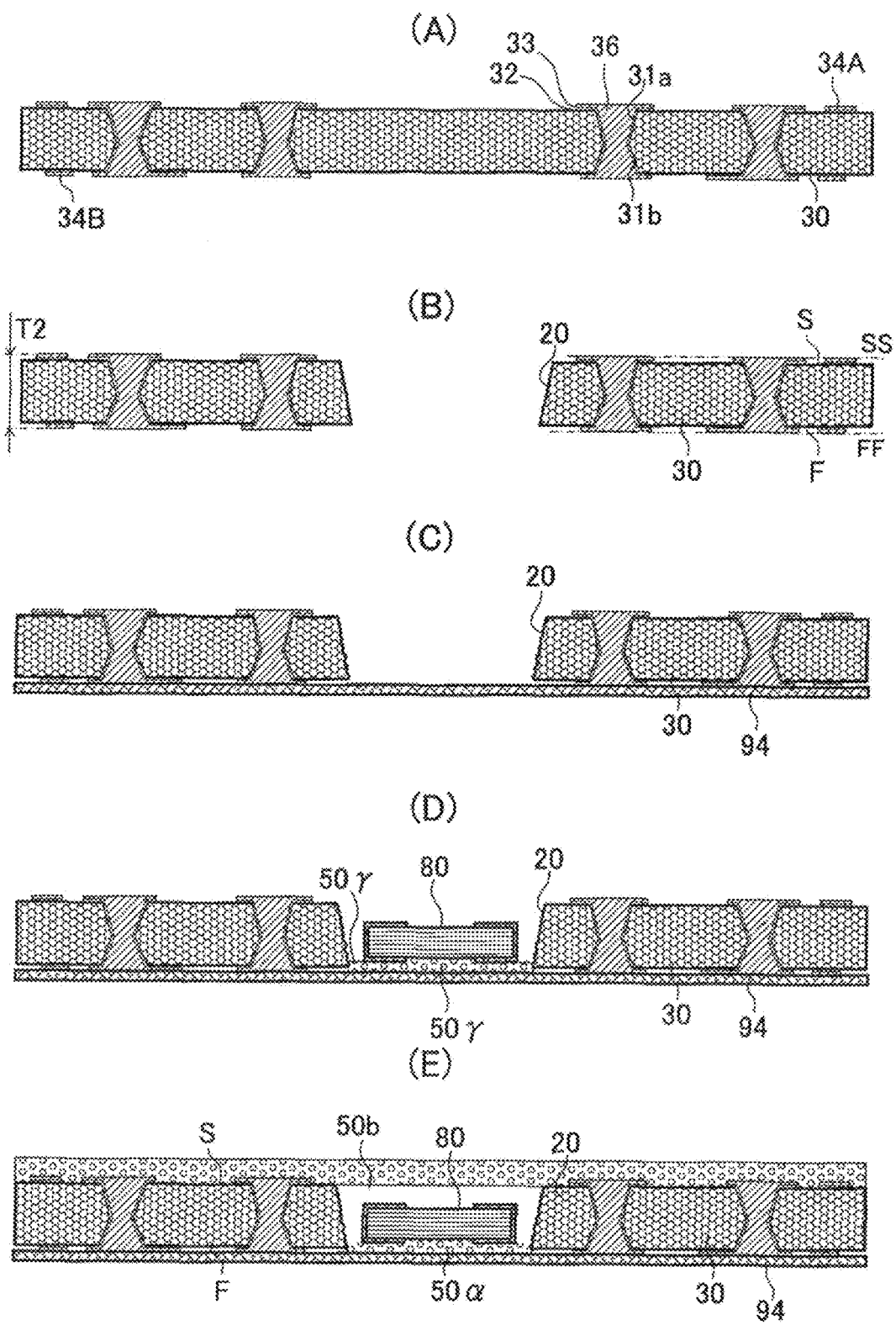
FIGS. 2(A)-2(E) are views showing a method for manufacturing a printed wiring board of the first embodiment.
Figure 3:
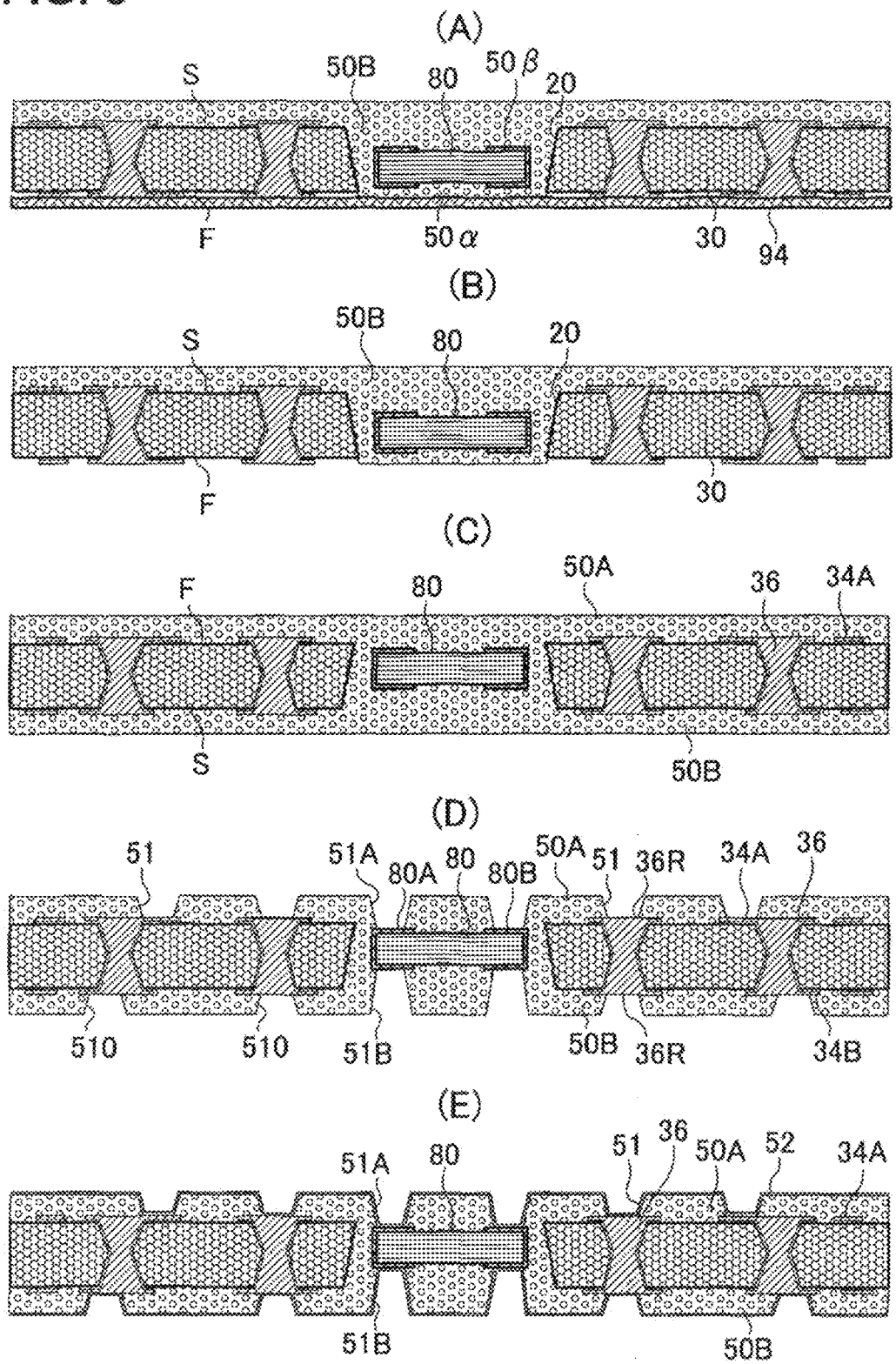
FIGS. 3(A)-3(E) are views showing a method for manufacturing a printed wiring board of the first embodiment.

The embodiments will now be described with reference to the accompanying drawings, wherein like reference numerals designate corresponding or identical elements throughout the various drawings.

First Embodiment

Figure 6:
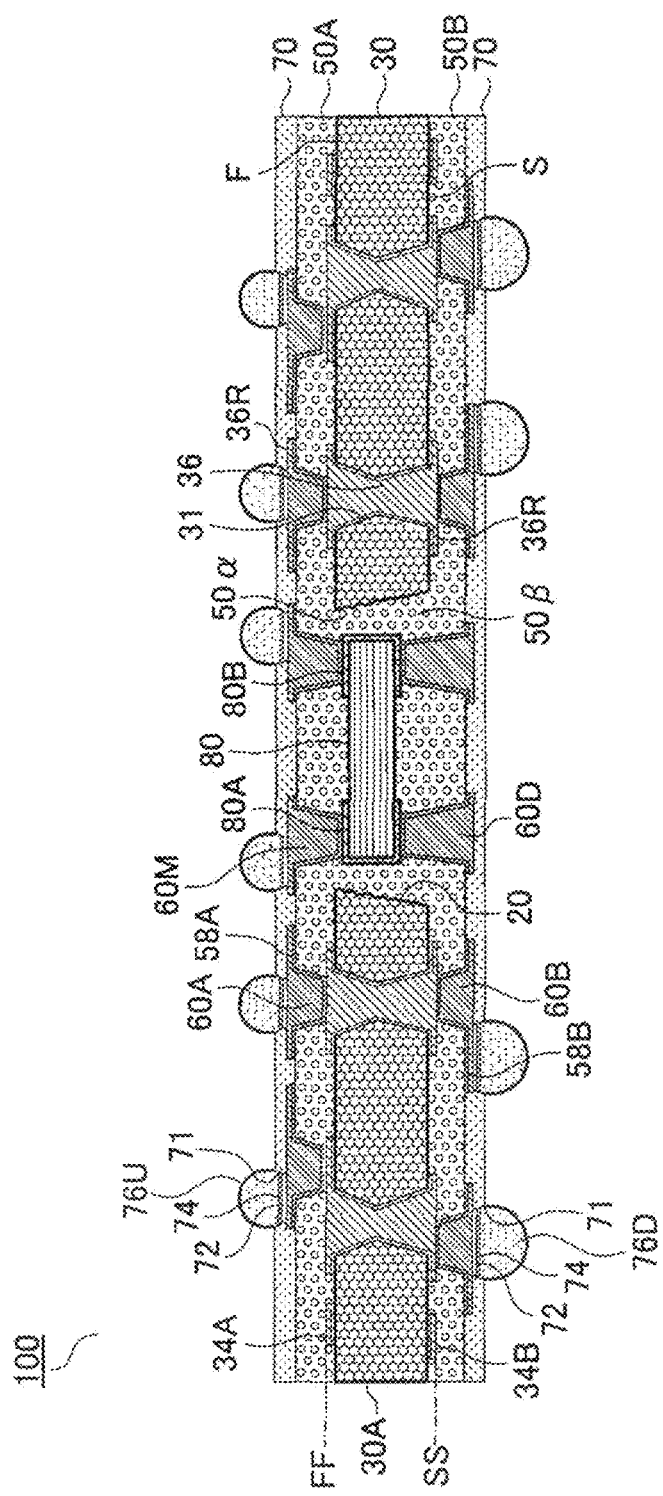
FIG. 6 is a cross-sectional view of a printed wiring board with solder bumps according to the first embodiment.

FIG. 6 shows a cross-sectional view of printed wiring board 100 with solder bumps according to a first embodiment of the present invention. In printed wiring board 100, electronic component 80 such as a ceramic capacitor is built into core substrate 30, and single-layer buildup layers are formed on the first and second surfaces of core substrate 30.

Figure 14:
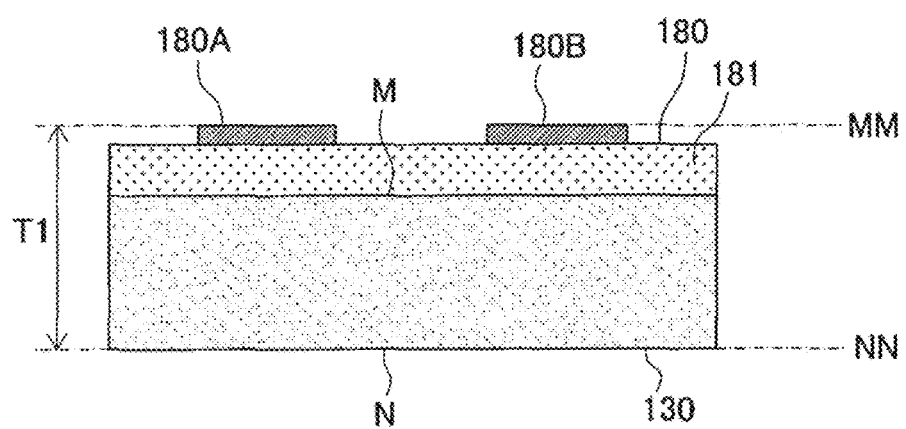
FIG. 14 is a view illustrating the structure of an IC chip.

Core substrate 30 includes insulative base (30A) with penetrating hole (opening) 20 to accommodate first electronic component 80, a first conductive layer (34A) formed on main surface (F) of the insulative base, and a second conductive layer (34B) formed on secondary surface (S) of the insulative base. The main surface is an opposite surface to the secondary surface. Penetrating hole (opening) 20 penetrates through the insulative base. The core substrate further includes through-hole conductor 36 which connects the first conductive layer and the second conductive layer. First surface (FF) of the core substrate corresponds to an upper surface of the first conductive layer, and second surface (SS) of the core substrate corresponds to an upper surface of the second conductive layer. Ceramic capacitor 80 is accommodated in penetrating hole 20 formed in the core substrate. An electronic component such as a ceramic capacitor has a main surface and a secondary surface opposite the main surface. When the electronic component is ceramic capacitor 80, main surface (M) and secondary surface (N) are surfaces of the body (ceramic laminate)

formed with a ceramic dielectric and inner electrodes (FIG. 13). When the electronic component is an IC chip, main surface (M) and secondary surface (N) opposite the main surface are surfaces of a silicon substrate (body) (FIG. 14). First electrode (80A) and second electrode (80B) are formed on the main surface of a ceramic laminate. Upper surfaces of the first electrode and the second electrode correspond to first surface (MM) of the ceramic capacitor (FIG. 13). Such a ceramic capacitor may further include third electrode (80C) and fourth electrode (80D) on secondary surface (N) of the body. Upper surfaces of the third electrode and the fourth electrode correspond to second surface (NN) of the ceramic capacitor (FIG. 13). First electrode (80A) on the main surface and the third electrode on the secondary surface are plus electrodes, and second electrode (80B) on the main surface and the fourth electrode on the secondary surface are minus electrodes. An electrode on the main surface and an electrode on the secondary surface are connected by side electrode (8000D) on a side wall of the body or by inner electrode (8800D) which penetrates through the body.

A wiring layer and electrodes are formed on main surface (M) of an IC chip. When the electronic component is an IC chip, first surface (MM) of IC chip 180 corresponds to the upper surfaces of electrodes (180A, 180B), and second surface (NN) of the IC chip corresponds to secondary surface (N) of substrate 130 (FIG. 14).

Main surface (M) of the electronic component and main surface (F) of the insulative base face the same direction, and secondary surface (N) of the electronic component and secondary surface (S) of the insulative base face the same direction. Resin fillers (50α, 50β) are filled in penetrating hole 20. Through-hole conductor 36 is formed by filling copper plating in penetrating hole 31 for a through-hole conductor in the insulative base. Penetrating hole 31 for a through-hole conductor is made up of first opening portion (31a) formed on the main-surface side of the insulative base and of second opening portion (31b) formed on the secondary-surface side of the insulative base. First opening portion (31a) tapers from the main surface toward the secondary surface. Second opening portion (31b) tapers from the secondary surface toward the main surface. First opening portion (31a) and second opening portion (31b) are connected in the core substrate.

An upper buildup layer is formed on main surface (F) of insulative base (30A), the first conductive layer and the main surface of the ceramic capacitor. The upper buildup layer is single-layered, having insulation layer (50A), conductive layer (58A) on the insulation layer, and via conductors (60A, 60M) which connect different conductive layers and penetrate through insulation layer (50A). In FIG. 6, via conductor (60A) connects conductive layer (34A) on the core substrate and conductive layer (58A) on the insulation layer, or connects a through-hole conductor and conductive layer (58A) on the insulation layer. Also, via conductor (upper connection via conductor) (60M) connects first electrode (80A) on the main surface of the ceramic capacitor (ceramic laminate) and conductive layer (58A), or connects second electrode (80B) on the main surface of the ceramic capacitor (ceramic laminate) and conductive layer (58A).

A lower buildup layer is formed on secondary surface (S) of insulative base (30A), the second conductive layer, and the secondary surface of the ceramic capacitor. The lower buildup layer is single-layered, having insulation layer (50B), conductive layer (58B) on the insulation layer, and via conductors (60B, 60D) which connect different conductive layers and penetrate through insulation layer (50B). In FIG. 6, via conductor (60B) connects conductive layer (34A) on the core substrate and conductive layer (58B) on the insulation layer, or connects a through-hole conductor and conductive layer (58B) on the insulation layer. Also, via conductor (lower connection via conductor) (60D) connects a third electrode on the secondary surface of the ceramic capacitor (ceramic laminate) and conductive layer (58B), or connects a fourth electrode on the secondary surface of the ceramic capacitor (ceramic laminate) and conductive layer (58B). It is an option for the lower buildup layer not to include a via conductor connected to an electrode of the ceramic capacitor.

Solder-resist layers 70 with openings 71, which expose conductive layers (58A, 58B), via conductors and connection via conductors, are formed on the upper and lower buildup layers. Solder bumps (76U, 76D) are formed on the conductors (pads) exposed through openings 71. The solder-resist layer on the upper buildup layer has a region for mounting an IC chip. An IC chip is mounted on the printed wiring board through solder bumps (76U) formed on the upper buildup layer. The printed wiring board is mounted on a motherboard through solder bumps (76D) formed on the lower buildup layer.

Figure 7:
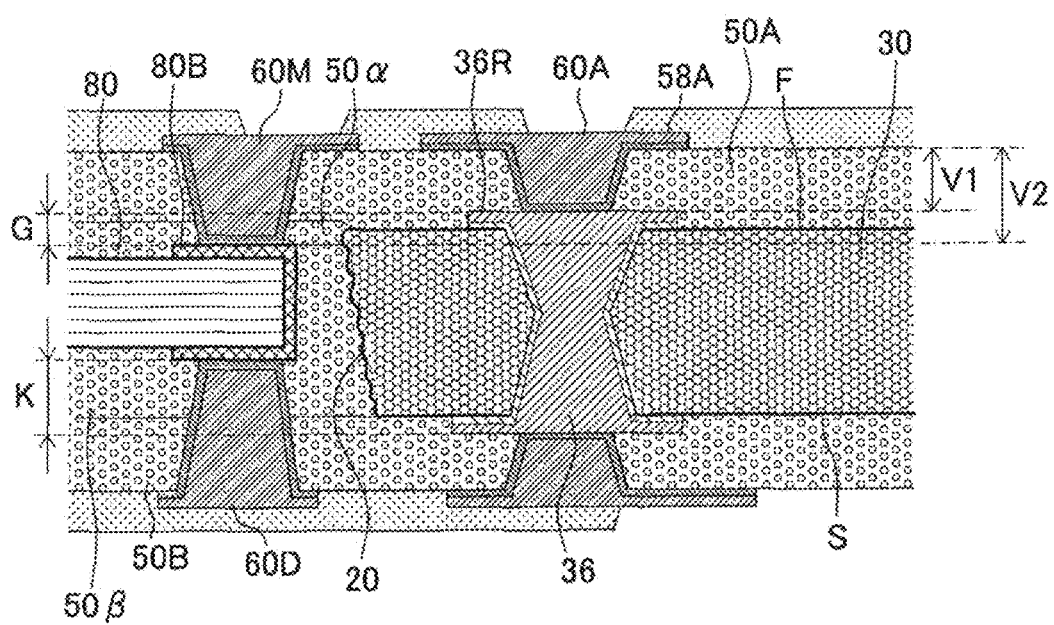
FIG. 7 is a magnified view showing part of the printed wiring board shown in FIG. 6.

FIG. 7 is a magnified view showing penetrating hole 20 for accommodating the electronic component in FIG. 6 and a ceramic capacitor. There is gap (G) between the first surface of the core substrate and the first surface of the electronic component. Gap (G) is greater than zero. Gap (G) is the distance between the upper surface of a conductive circuit positioned closest to opening 20 and the upper surface of an electrode positioned closest to the conductive circuit. Such a conductive circuit includes land (36R) of a through-hole conductor. Namely, first resin filler (50α) exists between insulation layer (50A) of the upper buildup layer and electronic component 80. First resin filler (50α) is present between insulation layer (50A) of the upper buildup layer and electronic component 80. The electrodes on the main surface of the electronic component are embedded in resin filler 50.

Therefore, when an insulation layer of the upper buildup layer is formed on the first surface of the electronic component, the insulation layer is not formed directly on the main surface of the electronic component or on the electrodes on the main surface of the electronic component. The insulation layer is formed on the electronic component with the resin filler placed in between. Accordingly, when the insulation layer is formed, pressure and heat are not directly exerted on the body and the electrodes of the electronic component. Especially, if an insulation layer contains reinforcing material such as glass cloth, and the insulation layer is formed directly on an electronic component, highly rigid reinforcing material may be pressed against the electrodes and the body of the electronic component. In such a case, the electrodes and the body of the electronic component may sustain damage. When the electronic component is a ceramic capacitor, since ceramic is fragile, its body may be damaged, causing deterioration in the quality of the ceramic capacitor. The electronic component may not be able to perform as initially designed.

When a via conductor is formed on an electrode on the main surface of the electronic component, the via conductor is formed in an insulation layer formed on the main surface of the electronic component. The thermal expansion coefficient value of the insulation layer is greater than the thermal expansion coefficient value of the electronic component. When an IC chip mounted on a printed wiring board is in operation, the temperature of the printed wiring board rises. When the temperature of the printed wiring board has risen, the amount of deformation of the insulation layer on the electronic component is greater than that of the electronic component. Therefore, stress is exerted on an electrode of the electronic component and on a connection via conductor connected to the electrode. The connection via conductor tends to be separated from the electrode. Especially, when the bottom diameter of the connection via conductor (the diameter of the opening for a connection via conductor on the electrode) is 50 µm or smaller, the above problem is noticeable. In the first embodiment, the connected portion of an electrode of the electronic component and a connection via conductor is positioned below the first surface of the core substrate and inside the core substrate in a cross-sectional direction. In the first embodiment, the thermal expansion coefficient (CTE) of the core substrate is set lower than the CTE of the insulation layer. Alternatively, their CTE values may be set the same. By positioning the connected portion of an electrode and a connection via conductor to be below the first surface of the core substrate, thermal stress exerted on the interface between the connection via conductor and the electrode is reduced. Therefore, in a printed wiring board according to the first embodiment, connection reliability is enhanced between an electronic component built into the printed wiring board and connection via conductors connected to the electronic component. To reduce thermal stress, the insulation layer on the electronic component is preferred to contain reinforcing material such as glass cloth.

Because of gap (G), the length of a connection via conductor connected to an electrode of the electronic component is longer than the length of a via conductor connected to a conductive layer of the core substrate. Therefore, stress caused by the difference in thermal expansion coefficients between the electronic component and the insulation layer is mitigated. Connection reliability is enhanced between an electrode of the electronic component and a connection via conductor connected to the electrode.

Considering a decrease in the quality of an electronic component and connection reliability between the electronic component and connection via conductors, gap (G) is preferred to be 2 µm to 20 µm. If gap (G) exists, the opening for connection via conductor (60A) becomes deeper, and the bottom diameter of the opening for a connection via conductor becomes smaller. Therefore, gap (G) is preferred not to exceed 20 µm. Accordingly, the bottom diameter of the opening for connection via conductor (60A) does not become smaller, thus preventing a reduction in the connection reliability between the connection via conductor and the electronic component. When the insulation layer contains reinforcing material such as glass cloth, gap (G) is preferred to be 5 µm or greater. When the insulation layer is laminated on the electronic component by thermal pressing, damage to the electronic component is suppressed, and the built-in electronic component functions as initially designed. In addition, the reinforcing material makes contact with a side wall of the connection via conductor, and the reinforcing material is thought to secure the connection via conductor. If the distance from the contact point of the reinforcing material and a connection via conductor to an electrode becomes greater, it is thought that the stress exerted on the contact surface between the electrode and the connection via conductor increases due to the principle of leverage. Therefore, gap (G) is preferred to be 15 µm or smaller. Also, forming openings for via conductors does not become more difficult.

In the first embodiment, since the thickness of the electronic component is less than the thickness of the core substrate, distance (K) exists between the second surface of the electronic component and the second surface of the core substrate (FIG. 7). When distance (K) is equal to gap (G), the printed wiring board of the first embodiment is preferred to include via conductor (60D) (lower connection via conductor), which reaches an electrode on the secondary surface of the body of a ceramic capacitor. Such via conductor (60D) is preferred to be formed as part of a circuit in the printed wiring board. When distance (K) is set in the same range as the above-described gap (G), a lower connection via conductor connected to an electrode formed on the secondary surface of the electronic component is preferred to be connected to the conductive layer of the lower buildup layer.

When distance (K) is greater than gap (G), the printed wiring board may have a dummy via conductor that reaches an electrode on the secondary surface of the body of the ceramic capacitor or reaches the secondary surface of the body of the ceramic capacitor. When distance (K) exceeds 20 µm, a via conductor formed on the secondary surface of the electronic component or on an electrode on the secondary surface is preferred to be a dummy via conductor. When a lower connection via conductor or a dummy via conductor is formed, the ceramic capacitor is sandwiched by via conductors. Thus, movement of the capacitor in the penetrating hole is suppressed due to thermal history, enhancing the connection reliability between the capacitor and the via conductors.

The same as with a capacitor, when an electronic component having electrodes on the main and secondary surfaces of the body of the electronic component is built into a printed wiring board, the printed wiring board may have a connection via conductor or a dummy via conductor the same as described above. When distance (K) is greater than gap (G), and distance (K) is 35 µm or less, a dummy via conductor is preferred to be formed. If distance (K) exceeds 35 µm, the via conductor becomes narrow and the dummy via conductor may be damaged by thermal stress. In such a case, impact originating at the damaged via conductor may cause damage to the printed wiring board. Therefore, the lower buildup layer is preferred not to have a via conductor reaching an electrode of the electronic component. The printed wiring board includes a connection via conductor only in the upper buildup layer.

When an electronic component such as an IC chip does not have an electrode on a secondary surface of the body of the electronic component, the printed wiring board may have a dummy via conductor reaching the second surface of the electronic component. However, if distance (K) exceeds 40 µm, it is preferred not to form a dummy via conductor. The printed wiring board includes a connection via conductor only in the upper buildup layer. A dummy via conductor does not work as a circuit, and is not connected to a circuit in the printed wiring board.

FIGS. 1-5 show a method for manufacturing printed wiring board 10 according to the first embodiment.

(1) A starting material is copper-clad laminate (20A), where 15 µm-copper foil 32 is laminated on both surfaces of insulative base (30A) made of epoxy resin or BT (bismaleimide triazine) resin and reinforcing material such as glass cloth. Insulative base (30A) has a main surface and a secondary surface opposite the main surface, and its thickness is 70~250 µm. If the insulative base is thinner than 70 µm, its strength is too low. If the thickness exceeds 250 µm, it is difficult to sandwich an electronic component with via conductors. Also, it is difficult to form tapered penetrating holes for through-hole conductors by a laser. First, a black-oxide treatment is conducted on the surfaces of copper foils 32 (FIG. 1(A)).

(2) A CO2 laser is irradiated from the main-surface (F) side of insulative base (30A) so that first opening portions (31a) narrowing from the main surface toward the secondary surface are formed on the main-surface side (FIG. 1(B)). First opening portions (31a) taper from main surface (F) toward secondary surface (S).

(3) A CO2 laser is irradiated from the secondary-surface (S) side of insulative base (30A) so that second opening portions (31b) narrowing from the secondary surface toward the main surface are formed on the secondary-surface side (FIG. 1(C)). Second opening portions (31b) taper from secondary surface (S) toward main surface (F).

(4) Electroless plating is performed to form electroless plated film 33 on the inner walls of penetrating holes and on copper foils 32. Electrolytic plating is further performed to form electrolytic plated film 37 on electroless plated film 33, and through-hole conductors 36 are formed in penetrating holes. Penetrating holes 31 are filled with electrolytic plated film. Through-hole conductors 36 made of plated film that is filled in penetrating holes are formed (FIG. 1(D)).

(5) Etching resist 35 with a predetermined pattern is formed on electrolytic plated film 37 on insulative base (30A) (FIG. 1(E)).

(6) Electrolytic plated film 37, electroless plated film 33 and copper foil 32 exposed from the etching resists are removed. Then, the etching resists are removed, and conductive layers 34 (34A, 34B) and through-hole conductors 36 are formed (FIG. 2(A)). Conductive layers (34A, 34B) include conductive circuits and lands of through-hole conductors. The conductive layer on the main surface of the insulative base is first conductive layer (34A), and the upper surface of the first conductive layer corresponds to first surface (FF) of the core substrate. The conductive layer on the secondary surface of the insulative base is second conductive layer (34B), and the upper surface of the second conductive layer corresponds to second surface (SS) of the core substrate. The first surface of the core substrate is opposite the second surface (FIG. 2(B)).

(7) Using a laser, penetrating hole (opening) 20 to accommodate an electronic component such as a capacitor is formed in the central portion of insulative base (30A). Core substrate 30 is completed (FIG. 2(B)). The laser is irradiated from the second-surface side. Penetrating hole 20 tapers from secondary surface (S) of the insulative base toward main surface (F). The size of the opening for the penetrating hole on the secondary surface of the insulative base is greater than the size of the opening of the penetrating hole on the main surface. Side walls of penetrating hole 20 taper from the secondary surface of the insulative base toward the main surface. It is also an option for side walls of penetrating hole (opening) 20 to be straight.

(8) Tape 94 made of PET film is placed on first surface (FF) of the core substrate so that penetrating hole 20 is covered (FIG. 2(D)).

(9) Resin film (50γ) is formed on tape 94 exposed through penetrating hole 20. Resin film (50γ) is formed using dispenser equipment or the like. The thickness of resin filler (50γ) is approximately 20 μm or less. An electronic component is mounted on the resin film using a mounter from the second-surface side of the core substrate (FIG. 2(E)). The size of the opening of the penetrating hole on the secondary surface of the insulative base is greater than the size of the opening of the penetrating hole on the main surface. Therefore, it is easy to place an electronic component in penetrating hole 20. Also, it is easier to secure the position of the electronic component in penetrating hole 20. After the mounting process, resin film (50γ) may be cured. The electronic component is secured on the resin film.

(10) Resin film (50b) such as B-stage prepreg is laminated on second surface (SS) of core substrate 30 so that penetrating hole 20 is covered (FIG. 2(E)). Resin and inorganic particles seep out from resin film (50b) into penetrating hole 20 by thermal pressing, and penetrating hole 20 is filled with resin (FIG. 3(A)). Resin film (50b) contains resin and inorganic particles such as silica. It is an option for resin film to contain reinforcing material such as glass cloth in addition to inorganic particles. When resin film contains reinforcing material, the thermal expansion coefficient of the insulation layer comes closer to the thermal expansion coefficient of the electronic component; and when resin film does not contain reinforcing material, damage to the electronic component from thermal pressing can be reduced.

By curing the resin filled in the penetrating hole and the resin of the resin film, first resin filler (50α) and second resin filler (50β) are formed in penetrating hole 20, and insulation layer (50B) is formed on the secondary surface of the insulative base, the second conductive layer and the electronic component. Insulation layer (50B) is the interlayer resin insulation layer of the lower buildup layer. The thickness of first resin filler (50α) is 20 μm or less. Namely, the first surface of the electronic component is positioned below the first surface of the core substrate, and the distance between the first surface of the core substrate and the first surface of the electronic component is greater than zero but 20 μm or less.

The ingredients of resin film (50γ) may be the same as the ingredients seeping out from the resin film into penetrating hole 20. If they are the same, since the electronic component is surrounded by the same material (resin filler 50) in penetrating hole 20, stress seldom concentrates in a specific portion of the electronic component. The electronic component is seldom damaged. Resin filler 50 contains inorganic particles and resin. The electronic component is preferred to be surrounded by one-type resin filler 50 containing resin and inorganic particles. The electronic component is secured to the core substrate in opening 20 by resin filler 50.

(11) After the tape is removed (FIG. 3(B)), resin film such as B-stage prepreg is laminated on first surface (FF) of core substrate 30. By curing the resin of the resin film, insulation layer (50A) is formed from the resin film on the main surface of the insulative base, the first conductive layer and the electronic component. Insulation layer (50A) is the interlayer resin insulation layer of the upper buildup layer. Resin filler 50 is present between insulation layer (50A) and the electronic component.

(12) In insulation layer (50A), openings (51A) are formed to reach electrodes 80 (80A, 80B) of the electronic component (electrodes formed on the main surface of the body of the electronic component). In addition, openings 51 are formed to reach the conductive layer or through-hole conductors. Depth (V2) of openings (51A) is greater than depth (V1) of openings 51 (see FIG. 7). The difference is greater than zero but 20 μm or less. In insulation layer (50B), openings (51B) are formed to reach electrodes (80C, 80D) of the electronic component (electrodes formed on the secondary surface of the body of the electronic component) or to reach the secondary surface of the electronic component. In the first embodiment, the distance between the second surface of the core substrate and the second surface of the electronic component exceeds 20 μm. In addition, openings 510 are formed to reach the conductive layer or through-hole conductors. The depth of openings (51B) is greater than the depth of openings 510 (see FIG. 3(D)). Using an oxidation agent such as permanganate, inner portions of openings (51, 510, 51A, 51B) are cleansed. Also, surfaces of insulation layers 50 (50A, 50B) are roughened (not shown in the drawings).

(13) Electroless plated film 52 is formed on surfaces of insulation layers 50 and on the inner walls of openings (51, 510, 51A, 51B) (FIG. 3(E)).

(14) Plating resist 54 is formed on electroless plated film 52 (FIG. 4(A)).

(15) Next, electrolytic plating is performed to form electrolytic plated film 56 on the electroless plated film exposed from plating resists 54 (see FIG. 4(B)).

(16) Then, plating resists 54 are removed by 5% NaOH. Electroless plated films between portions of electrolytic plated film are removed to form conductive layers 58 (58A, 58B), via conductors (60A, 60B), upper connection via conductors (60M) and dummy via conductors (60D), which are made up of electroless plated film 52 and electrolytic plated film 56 (FIG. 4(C)). Conductive layers 58 include conductive circuits and lands of via conductors. Insulation layers, conductive layers 58 on the insulation layers and via conductors penetrating through the insulation layers and connecting different conductive layers form the upper buildup layer and lower buildup layer. The upper buildup layer is formed on the main surface of the insulative base, and the lower buildup layer is formed on the secondary surface of the insulative base.

(17) Solder-resist layers 70 with openings 71 are formed on the upper and lower buildup layers. Printed wiring board 10 is completed (FIG. 5(A)). Conductive layers or via conductors exposed through openings 71 work as pads. The solder resist on the upper buildup layer is the upper solder-resist layer, and the solder resist on the lower buildup layer is the lower solder-resist layer.

(18) Metal film made of nickel layer 72 and gold layer 74 in that order is formed on the pads (FIG. 5(B)). Other metal films such as tin and Ni/Pd/Au may also be used.

(19) Then, solder bumps (76U) are formed on the pads exposed through openings 71 of the upper solder-resist layer. Solder bumps (76D) are formed on the pads exposed through openings 71 of the lower solder-resist layer. Printed wiring board 100 with solder bumps is completed (FIG. 6).

A second electronic component such as an IC chip is mounted on printed wiring board 100 through solder bumps (76U) of the upper buildup layer.

Second Embodiment

Figure 8:
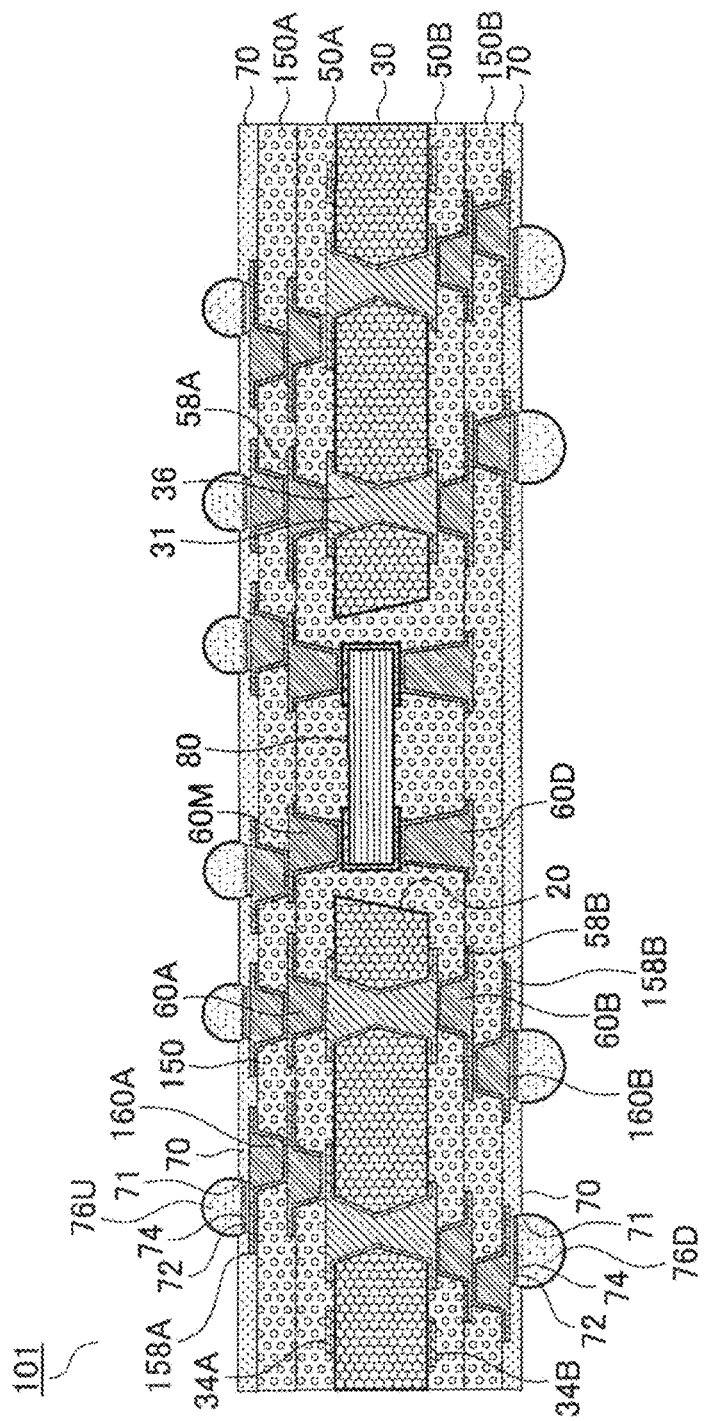
FIG. 8 is a cross-sectional view of a printed wiring board according to a second embodiment.

FIG. 8 shows a printed wiring board according to a second embodiment. The buildup layers of the first embodiment are single-layered, but the buildup layers of the second embodiment are double-layered. Insulation layers (50A, 50B) on the insulative base contain reinforcing material, while second-layer insulation layers (150A, 150B) do not contain reinforcing material. By sandwiching the core substrate with insulation layers containing reinforcing material, connection reliability is enhanced between an electronic component and the via conductors connected to the electronic component. Then, fine via conductors are formed in the second and subsequent insulation layers since the layers do not contain reinforcing material. A highly integrated printed wiring board with high connection reliability is obtained.

A printed wiring board according to the second embodiment is obtained by the following method.

Procedures in steps (1) through (16) in the first embodiment are conducted. Then, insulation layers (150A, 150B) made of inorganic particles and resin are formed on insulation layers (50A, 50B). Next, openings for via conductors are formed to reach conductive layers 58 or via conductors (60B, 60A, 60M). Then, step (13) and subsequent steps are conducted. Printed wiring board 101 with solder bumps is completed as shown in FIG. 8. Since a printed wiring board of the second embodiment is formed in the same manner as a printed wiring board of the first embodiment, the same effects are achieved as in the first embodiment.

Third Embodiment

Figure 9:
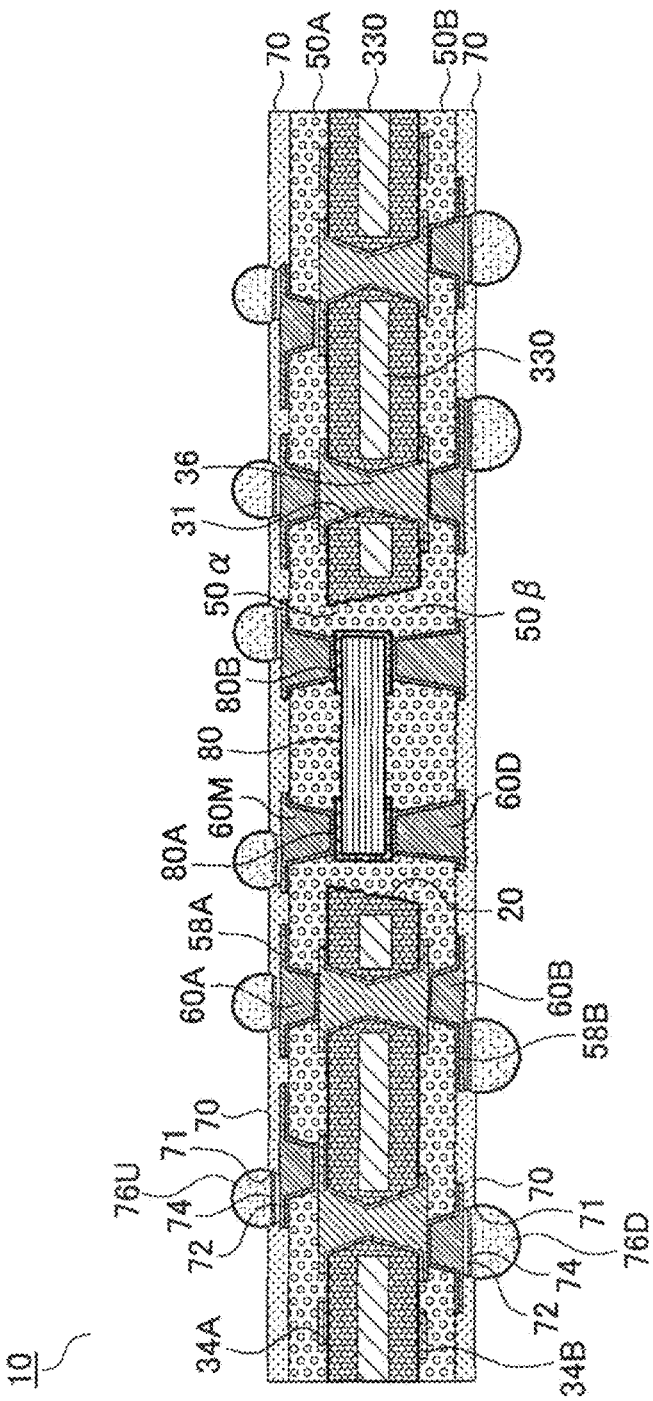
FIG. 9 is a cross-sectional view of a printed wiring board according to a third embodiment.

FIG. 9 shows a printed wiring board according to a third embodiment. The printed wiring board of the third embodiment further includes metal layer 330 in the central portion of core substrate 30. The rest of the printed wiring board according to the third embodiment is the same as the printed wiring board of the first embodiment. Because of the metal layer, heat radiation is improved in the printed wiring board, enhancing connection reliability between an electronic component and the via conductors connected to the electronic component.

Fourth Embodiment

Figure 10:
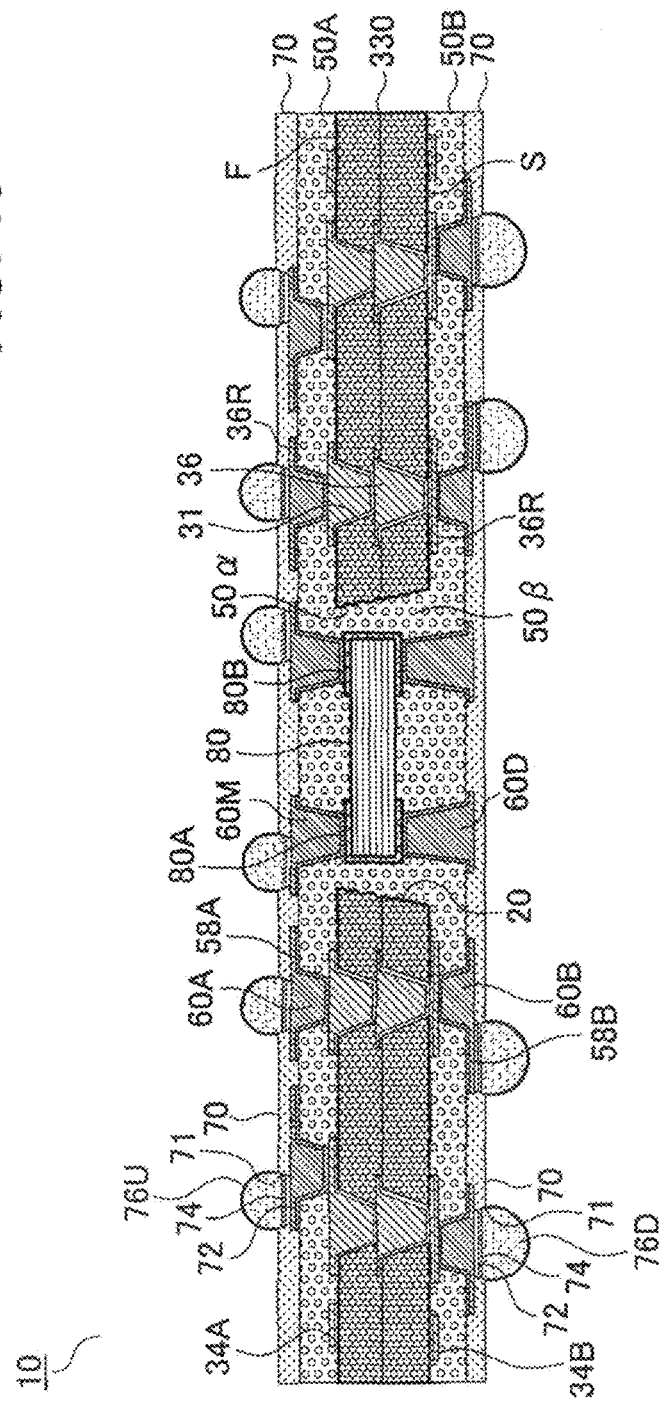
FIG. 10 is a cross-sectional view of a printed wiring board according to a fourth embodiment.

FIG. 10 shows a printed wiring board according to a fourth embodiment. In the fourth embodiment, core substrate 30 is formed with multiple resin substrates. Each resin substrate contains reinforcing material. Then, the conductive layers on the upper and lower surfaces of core substrate 30 are connected by a stacked-via structure. Such a stacked-via structure is formed by stacking via conductors that penetrate through their respective resin substrates. The same effects as those in the first embodiment are achieved in the fourth embodiment.

Fifth Embodiment

Figure 11:
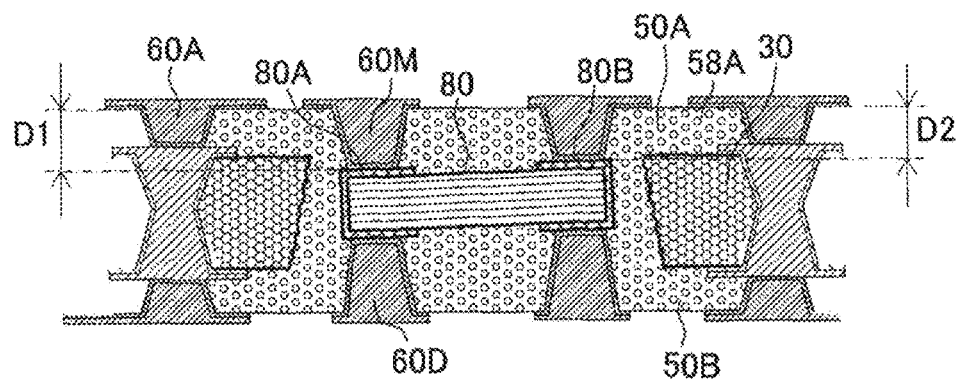
FIG. 11 is a view showing part of a printed wiring board according to a fifth embodiment.

FIG. 11 shows part of a printed wiring board according to a fifth embodiment. Penetrating hole (opening) 20 and an electronic component built into the hole are magnified. In the fifth embodiment, electronic component 80 such as a capacitor is tilted in penetrating hole 20. Depth (D1) of the opening for a via conductor that reaches electrode (first electrode) (80A) of capacitor 80 shown in the left part in the drawing is different from depth (D2) of the opening for a via conductor that reaches electrode (second electrode) (80B) shown in the right part. In such a structure as well, since there is a gap between the upper surface of first electrode (80A) of capacitor 80 and first surface (FF) of the core substrate, first electrode (80A) of the capacitor and insulation layer (50A) seldom make contact. Thus, the risk for the capacitor to sustain damage is reduced. In the same manner, since there is a gap between the upper surface of second electrode (80B) of capacitor 80 and first surface (FF) of the core substrate, pressure is unlikely to be exerted directly on the electronic component. Therefore, the electronic component is seldom damaged. When an electronic component is tilted in opening 20, the electronic component tends to be damaged when insulation layers are formed. Therefore, the printed wiring board is preferred to have gap (G). Especially, when insulation layers contain reinforcing material and an electronic component is tilted in the opening, the printed wiring board is preferred to have gap (G).

Sixth Embodiment

In a sixth embodiment, distance (K) between the second surface of the core substrate and the second surface of an electronic component is set at 20 μm or less. Therefore, a via conductor (lower connection via conductor) that reaches an electrode formed on the secondary surface of the electronic component functions as part of a circuit in the printed wiring board. Accordingly, such a via conductor is connected to a conductive layer or a via conductor in the printed wiring board. The printed wiring board according to the sixth embodiment is manufactured by the same method as in the first embodiment. The same effects as in the first embodiment are achieved in the sixth embodiment.

Seventh Embodiment

Figure 12:
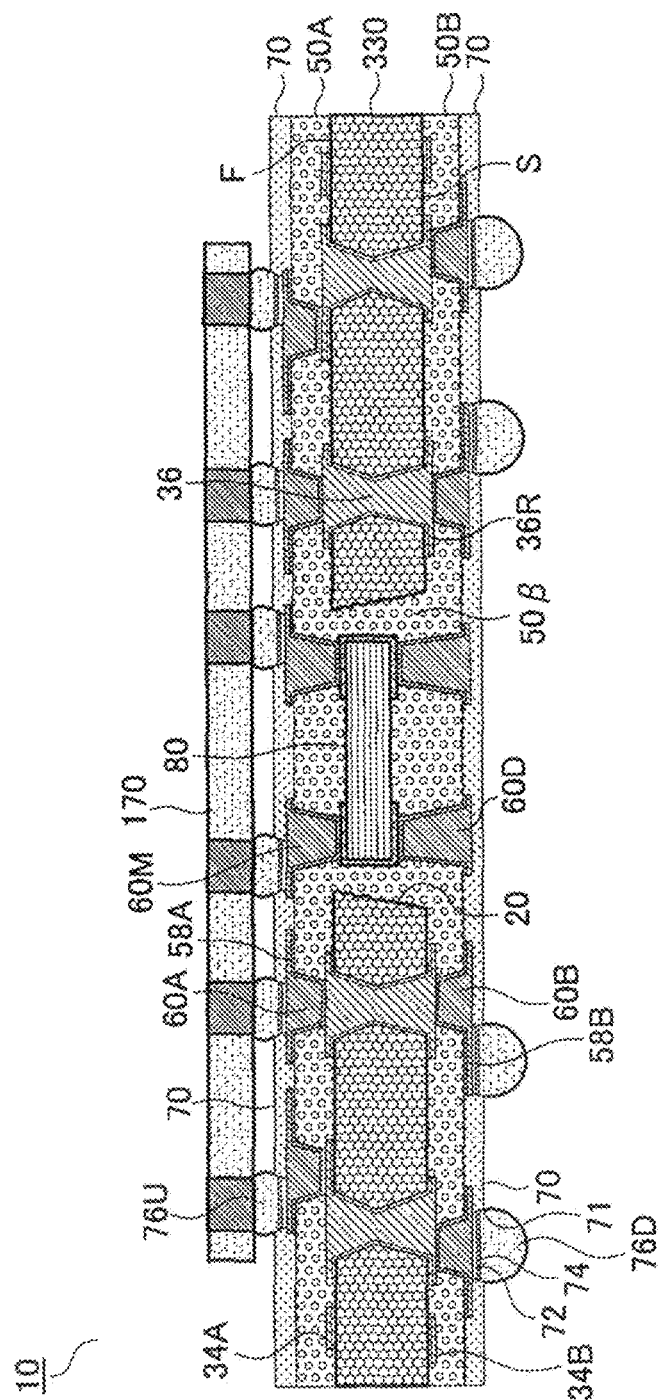
FIG. 12 is an applied example of the printed wiring board of the first embodiment.

FIG. 12 shows a printed wiring board according to a seventh embodiment. In the seventh embodiment, interposer 170 is mounted on the upper surface of printed wiring board 100.

In each embodiment, when insulation layer (50A) is formed on a first surface of a core substrate, direct pressure is unlikely to be exerted on an electronic component. After being built in, the electronic component functions as initially designed.

EXAMPLE (1) A starting material is copper-clad laminate (20A), where 15 μm-copper foil 32 is laminated on both surfaces of insulative substrate (30A) made of epoxy resin and glass cloth. The thickness of insulative base (30A) is 0.15 mm, and the base has a main surface and a secondary surface opposite the main surface (FIG. 1(A)).

(2) A CO2 laser is irradiated from the main-surface (F) side of insulative substrate (30A) so that first opening portions (31a) narrowing from the main surface toward the secondary surface are formed on the main-surface side (FIG. 1(B)).

(3) A CO2 laser is irradiated from the secondary-surface (S) side of insulative substrate (30A) so that second opening portions (31b) narrowing from the secondary surface toward the main surface are formed on the secondary-surface side. Penetrating holes 31 for through-hole conductors, which are made up of the first opening portions and second opening portions, are formed (FIG. 1(C)).

(4) Electroless copper plating is performed to form electroless copper-plated film 33 on the inner walls of the penetrating holes and on copper foils 32. Electrolytic copper plating is further performed to form electrolytic copper-plated film 37 on electroless copper-plated film 33, and through-hole conductors 36 are formed in the penetrating holes (FIG. 1(D)).

(5) Etching resist 35 with a predetermined pattern is formed on electrolytic copper-plated film 37 on insulative base (30A) (FIG. 1(E)).

(6) Electrolytic copper-plated film 37, electroless copper-plated film 33 and copper foil 32 exposed from the etching resists are removed. Then, the etching resists are removed, and conductive layers (34A, 34B) and through-hole conductors 36 are formed (FIG. 2(A)). Conductive layers (34A, 34B) include conductive circuits and lands of the through-hole conductors. The thickness of the first and second conductive layers is 25 μm.

(7) Penetrating hole 20 for accommodating a capacitor is formed in the central portion of the insulative base using a laser (FIG. 2(B)). Penetrating hole 20 tapers from secondary surface (S) of the insulative base toward main surface (F). Thickness (T2) of the core substrate is 0.2 mm (FIG. 2(B)).

(8) PET film 94 is placed on first surface (FF) of the core substrate to cover penetrating hole 20 (FIG. 2(C)).

(9) Using dispenser equipment, resin film (50γ) is formed on tape 94 exposed through penetrating hole 20. The thickness of resin film (50γ) is approximately 5 μm. A ceramic capacitor is mounted on the resin film using a mounter from the second-surface side of the core substrate. The thickness of the ceramic capacitor (distance from the first surface to the second surface) is 165 μm (FIG. 13). In FIG. 13, (T1) is the thickness of the electronic component.

(10) ABF-GX13GC (made by Ajinomoto Fine-Techno Co., Ltd.) (50b) is laminated on second surface (SS) of core substrate 30 to cover penetrating hole 20. By thermal pressing, resin and inorganic particles seep out from ABF-GX13GC (50b) into penetrating hole 20, and the resin is filled in penetrating hole 20. The resin is cured and insulation layer (50B) is formed on the secondary surface of the insulative base and the second conductive layer. Also, resin filler is formed in the penetrating hole. The ceramic capacitor is surrounded by the resin filler in the penetrating hole (FIG. 3(A)). Gap (G) is 5 μm. Since the ingredients of resin film (50γ) and the ingredients seeping out from ABF-GX13GC into the penetrating hole are the same, the ceramic capacitor is surrounded by one-type resin filler 50.

(11) After the tape is removed (FIG. 3(B)), ABF-GX13GC (made by Ajinomoto Fine-Techno Co., Ltd.) is laminated on first surface (FF) of core substrate 30. By curing ABF-GX13GC, insulation layer (50A) is formed on the main surface of the insulative base and on the first conductive layer (FIG. 3(C)). The thickness of insulation layers (50A, 50B) is 50 μm.

(12) Openings (51A) are formed in insulation layer (50A) to reach electrodes (80A, 80B) of the capacitor. In addition, openings 51 are formed to reach the conductive layer or through-hole conductors. The depth of openings 51 is 25 μm, and the depth of openings (51A) is 30 μm. Openings (51B) are formed in insulation layer (50B) to reach electrodes (80C, 80D) of the ceramic capacitor. The distance is 55 μm between the second surface of the core substrate and the second surface of the capacitor. In addition to openings (51B), openings 510 are formed to reach the conductive layer or through-hole conductors. The depth of openings (51B) is greater than the depth of openings 510 (25 μm) (see FIG. 3(D)). Since distance (K) is 30 μm, openings (51B) are the openings for dummy via conductors.

(13) Electroless copper-plated film 52 is formed on the surfaces of insulation layers 50 and the inner walls of openings (51, 510, 51A, 51B) (FIG. 3(E)).

(14) Plating resist 54 is formed on electroless plated film 52 (FIG. 4(A)).

(15) Next, electrolytic plating is performed to form electrolytic plated film 56 on the electroless copper-plated films exposed from plating resists 54 (see FIG. 4(B)).

(16) Then, plating resists 54 are removed by 5% NaOH. Electroless plated films between portions of electrolytic plated films are removed to form conductive layers 58, via conductors (60B, 60A, 60M) and dummy via conductors (60D), which are made of electroless plated film 52 and electrolytic plated film 56 (FIG. 4(C)). Upper and lower buildup layers are formed.

(17) Solder-resist layers 70 having openings 71 are formed on the upper and lower buildup layers. Printed wiring board 100 is completed (FIG. 5(A)).

(19) Metal film made of nickel layer 72 and gold layer 74 in that order is formed on pads (FIG. 5(B)).

(20) Then, solder bumps (76U) are formed on the pads exposed through openings 71 of the upper solder-resist layer. Solder bumps (76D) are formed on the pads exposed through openings 71 of the lower solder-resist layer. Printed wiring board 100 with solder bumps is completed (FIG. 6). An IC chip is mounted on printed wiring board 10 through solder bumps (76U) of the upper buildup layer.

Since there is gap (G) between the upper surface of electrode (80A) of electronic component 80 and first surface (FF) of the core substrate, electrode (80A) of the capacitor and insulation layer (50A) containing core material are unlikely to make contact. Therefore, a decrease in the quality of the electronic component is suppressed.

When the first surface of a core substrate and the first surface of a ceramic capacitor are polished and a resin insulation layer is formed on those surfaces, the resin insulation layer is thought to be formed directly on the ceramic capacitor. When the resin insulation layer is formed by thermal pressing, it is thought that the body of the ceramic capacitor and its electrodes may be damaged by the heat and pressure. The ceramic capacitor may break. In addition, it is thought that the capacitance of the ceramic capacitor may change. The connection reliability of a printed wiring board having the ceramic capacitor is thought to be reduced.

A printed wiring board according to an embodiment of the present invention has the following: an insulative base having a main surface and a secondary surface opposite the main surface and having a penetrating hole to accommodate an electronic component; a first conductive layer formed on the main surface of the insulative base; a second conductive layer formed on the secondary surface of the insulative base; a first electronic component having an electrode and being accommodated in the penetrating hole in such a way that the electrode faces the main surface of the insulative substrate; an upper buildup layer formed on the main surface of the insulative base and on the first electronic component and having a pad for mounting a second electronic component and a via conductor connected to the electrode; and a lower buildup layer formed on the secondary surface of the insulative base and on the first electronic component. In such a wiring board, a gap (G) exists between an upper surface of the electrode of the first electronic component and an upper surface of the first conductive layer, and the gap (G) is set greater than zero.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate comprising an insulative base material and having a penetrating hole configured to accommodate an electronic component;
   a first conductive layer formed on a first surface of the core substrate;
   a second conductive layer formed on a second surface of the core substrate on an opposite side of the first surface of the core substrate;
   a first electronic component having an electrode and accommodated in the penetrating hole of the core substrate such that the electrode of the first electronic component faces the first surface of the core substrate;
   a first buildup structure formed on the first surface of the core substrate and on the first electronic component and including a pad configured to mount a second electronic component on the first buildup structure and a via conductor connected to the electrode of the first electronic component; and
   a second buildup structure formed on the second surface of the core substrate and on the first electronic component,
   wherein the electrode of the first electronic component has an upper surface facing toward the first surface of the core substrate, the first conductive layer has an upper surface facing away from the first surface of the core substrate, and the first electronic component is positioned in the penetrating hole of the core substrate such that the upper surface of the electrode of the first electronic component forms a gap which is set in a range of 20 µm or smaller with respect to the upper surface of the first conductive layer and that the first electronic component is tilted with respect to the first surface of the core substrate.

2. The printed wiring board according to claim 1, wherein the first electronic component is a capacitor comprising a ceramic laminate having a first electrode and a second electrode formed on a first surface of the ceramic laminate and a third electrode and a fourth electrode formed on a second surface of the ceramic laminate on an opposite side of the first surface of the ceramic laminate, and the first electrode and the second electrode of the capacitor face in the direction of the first surface of the core substrate.

3. The printed wiring board according to claim 2, wherein the first electrode and the third electrode are connected by one of a side wall conductor and an inner conductor of the ceramic laminate, and the second electrode and the fourth electrode are connected by one of a side wall conductor and an inner conductor of the ceramic laminate.

4. The printed wiring board according to claim 2, wherein the second buildup layer has a dummy via conductor connected to at least one of the third electrode and fourth electrode of the capacitor.

5. The printed wiring board according to claim 2, wherein the core substrate further includes an inner-layer metal layer.

6. The printed wiring board according to claim 2, wherein the first buildup structure comprises an insulation layer comprising a resin, the insulation layer has a first via hole and a second via hole extending through the insulation layer and reaching to the first electrode and second electrode of the first electronic component, respectively, and the first buildup structure has a first via conductor formed in the first via hole formed through the insulation layer and a second via conductor formed in the second via hole formed through the insulation layer.

7. The printed wiring board according to claim 2, wherein the first buildup structure comprises an insulation layer comprising a resin, the insulation layer has a first via hole and a second via hole extending through the insulation layer and reaching to the first electrode and second electrode of the first electronic component, respectively, and the first buildup structure has a first via conductor comprising a plating material filling the first via hole formed through the insulation layer and a second via conductor comprising a plating material filling the second via hole formed through the insulation layer.

8. The printed wiring board according to claim 2, wherein the first buildup structure comprises an insulation layer comprising a resin, the insulation layer has a first via hole and a second via hole extending through the insulation layer and reaching to the first electrode and second electrode of the first electronic component, respectively, the first buildup structure has a first via conductor formed in the first via hole formed through the insulation layer and a second via conductor formed in the second via hole formed through the insulation layer, and the second buildup layer has a dummy via conductor connected to at least one of the third electrode and fourth electrode of the capacitor.

9. The printed wiring board according to claim 2, wherein the first buildup structure comprises an insulation layer comprising a resin, the insulation layer has a first via hole and a second via hole extending through the insulation layer and reaching to the first electrode and second electrode of the first electronic component, respectively, the first buildup structure has a first via conductor comprising a plating material filling the first via hole formed through the insulation layer and a second via conductor comprising a plating material filling the second via hole formed through the insulation layer, and the second buildup layer has a dummy via conductor connected to at least one of the third electrode and fourth electrode of the capacitor.

10. The printed wiring board according to claim 1, wherein the electronic component has a thickness which is in a range of from 120 μm to 160 μm, the second conductive layer has an upper surface facing away from the second surface of the core substrate, and the upper surface of the first conductive layer and the upper surface of the second conductive layer are separated by a distance which is in a range of from 170 μm to 250 μm.

11. The printed wiring board according to claim 1, further comprising a through-hole conductor formed in a through hole penetrating through the core substrate, wherein the through hole in the core substrate has a first opening portion narrowing from the first surface of the core substrate toward the second surface of the core substrate and a second opening portion narrowing from the second surface of the core substrate toward the first surface of the core substrate.

12. The printed wiring board according to claim 1, further comprising an interposer mounted on the first buildup structure.

13. The printed wiring board according to claim 1, wherein the first buildup structure comprises an insulation layer comprising a resin.

14. The printed wiring board according to claim 1, wherein the first buildup structure comprises an insulation layer comprising a resin, and the resin of the insulation layer is filling a space remaining in the penetrating hole of the core substrate.

15. The printed wiring board according to claim 1, wherein the first buildup structure comprises an insulation layer comprising a resin, and the second buildup structure comprises an insulation layer comprising a resin.

16. The printed wiring board according to claim 1, wherein the first buildup structure comprises an insulation layer comprising a resin, the insulation layer has a via hole extending through the insulation layer and reaching to the electrode of the first electronic component, and the via conductor is formed in the via hole formed through the insulation layer.

17. The printed wiring board according to claim 1, wherein the first buildup structure comprises an insulation layer comprising a resin, the insulation layer has a via hole extending through the insulation layer and reaching to the electrode of the first electronic component, and the via conductor comprises a plating material filling the via hole formed through the insulation layer.

18. The printed wiring board according to claim 1, further comprising an interposer mounted on the first buildup structure and connected to the first electronic component through the via conductor.

19. The printed wiring board according to claim 1, further comprising a through-hole conductor formed in a through hole penetrating through the core substrate, wherein the through-hole conductor is connecting a conductive circuit in the first conductive layer and a conductive circuit in the second conductive layer, the through hole in the core substrate has a first opening portion narrowing from the first surface of the core substrate toward the second surface of the core substrate and a second opening portion narrowing from the second surface of the core substrate toward the first surface of the core substrate.

* * * * *